(12) United States Patent
Yamazaki et al.

(10) Patent No.: US 6,373,870 B1
(45) Date of Patent: Apr. 16, 2002

(54) LASER IRRADIATION APPARATUS AND LASER IRRADIATION METHOD

(75) Inventors: Shunpei Yamazaki, Tokyo; Koichiro Tanaka; Naoto Kusumoto, both of Kanagawa, all of (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/141,763

(22) Filed: Aug. 27, 1998

Related U.S. Application Data

(62) Division of application No. 08/800,026, filed on Feb. 12, 1997, now Pat. No. 5,815,494.

(51) Int. Cl.⁷ .................................................. H01S 3/10
(52) U.S. Cl. ........................................... 372/25; 372/24
(58) Field of Search .............................. 372/25, 24, 28, 372/69, 29, 32, 33, 31; 219/121.62

(56) References Cited

U.S. PATENT DOCUMENTS

| | | | |
|---|---|---|---|
| 5,010,230 A | * 4/1991 | Uemura ................. | 219/121.62 |
| 5,145,808 A | 9/1992 | Sameshima et al. ........ | 437/173 |
| 5,263,039 A | * 11/1993 | Skupsky et al. .............. | 372/25 |
| 5,473,412 A | * 12/1995 | Ozawa ........................ | 372/25 |
| 5,533,040 A | * 7/1996 | Zhang ......................... | 372/25 |
| 5,643,801 A | 7/1997 | Ishihara et al. | |
| 5,756,364 A | 5/1998 | Tanaka et al. | |
| 5,767,003 A | 6/1998 | Noguchi ..................... | 437/173 |
| 5,812,569 A | * 9/1998 | Walker et al. ................ | 372/25 |
| 5,815,494 A | * 9/1998 | Yamazaki et al. ............ | 372/25 |
| 5,854,803 A | * 12/1998 | Yamazaki et al. ............ | 372/31 |
| 5,891,764 A | 4/1999 | Ishihara et al. | |
| 5,905,749 A | * 5/1999 | Iwashiro et al. .............. | 372/33 |
| 6,008,101 A | 12/1999 | Tanaka et al. | |
| 6,096,581 A | 8/2000 | Zhang et al. ................ | 438/149 |

FOREIGN PATENT DOCUMENTS

| | | |
|---|---|---|
| JP | 60-25711 | 12/1985 |
| JP | 02-177422 | 7/1990 |
| JP | 03-286518 | 12/1991 |
| JP | 04-102311 | 4/1992 |
| JP | 04-307727 | 10/1992 |
| JP | 07-307304 | 11/1995 |
| JP | 09-082662 | 3/1997 |

\* cited by examiner

Primary Examiner—Leon Scott, Jr.
(74) Attorney, Agent, or Firm—Fish & Richardson P.C.

(57) ABSTRACT

Laser annealing is performed by irradiating, while scanning, a semiconductor thin-film with laser light. The laser light that is linear on the irradiation surface is moved in its line-width direction and applied non-continuously. The laser light has, in its line-width direction, an energy density profile that assumes a step-like form in which the energy density varies in a step-like manner. In particular, the scanning pitch D and the step widths $L_n$ are so set as to satisfy a relationship $L_n \geq D$.

20 Claims, 16 Drawing Sheets

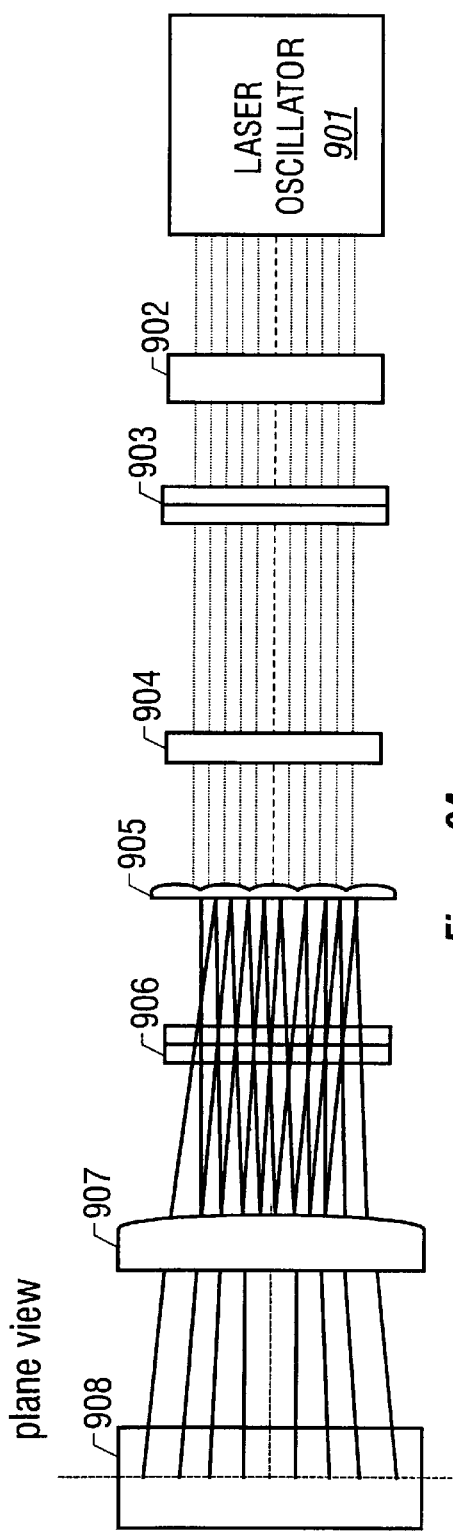
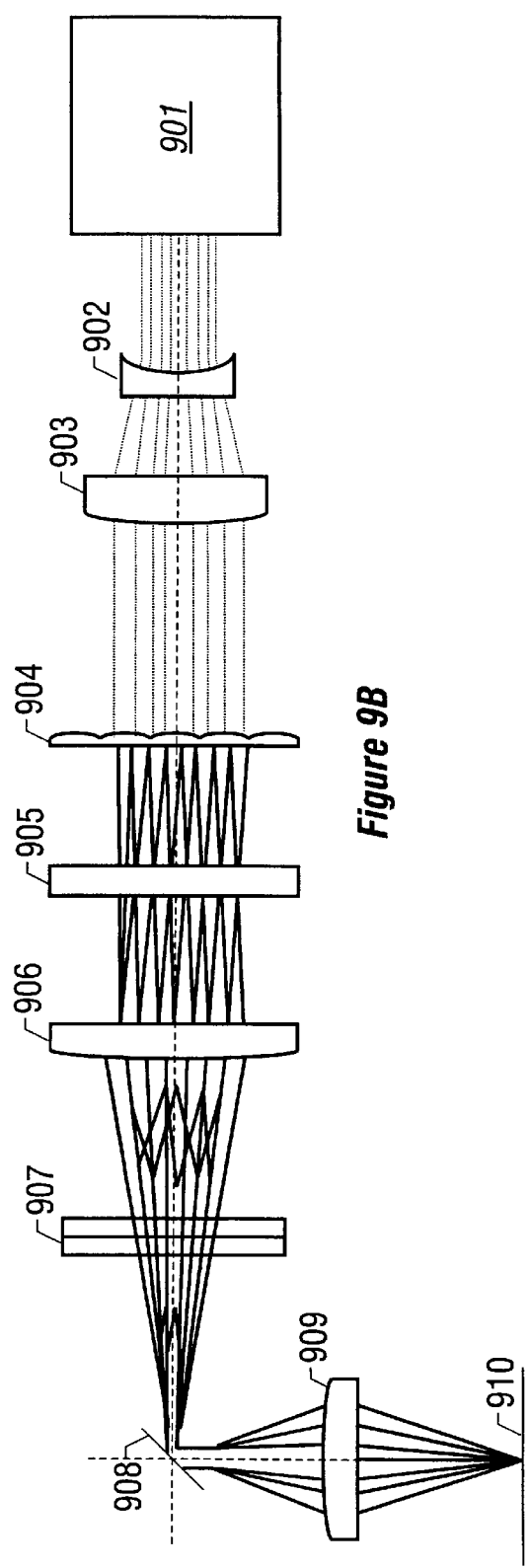

LASER IRRADIATION APPARATUS AND LASER IRRADIATION METHOD

This is a divisional of U.S. application Ser. No. 08/800,026, filed Feb. 12, 1997, now U.S. Pat. No. 5,815,494.

BACKGROUND OF THE INVENTION

1. Field of the Invention

The present invention relates to annealing of a semiconductor thin film by irradiation with laser light.

2. Description of the Related Art

Extensive studied have been made of laser annealing techniques in which an amorphous or crystalline semiconductor thin film formed on a substrate is illuminated with laser light to crystallize or improve the crystallinity of the semiconductor thin film.

In particular, by using a laser light having a line-shaped cross section (linear laser light, hereinafter), annealing can be performed uniformly with high productivity.

A description will be made of linear laser light. Usually, laser light as output from a laser light source has a spot-like cross-section of a several centimeter square. This laser light is expanded and made uniform by a homogenizer or a beam expander, and then converged by a cylindrical lens. Thus, linear laser light is obtained which has a size of several millimeters by several tens of centimeters on an irradiation surface.

By inserting a slit between the cylindrical lens and the irradiation surface, the energy density profile of the linear laser light in its line-width direction on the irradiation surface is rendered rectangular, to enable more uniform annealing.

The laser light source is a pulsed laser having large output power, such as an excimer laser. After a crystalline silicon film is annealed with laser light of a low energy density, annealing is again performed with laser light of a high energy density.

This procedure can not only provide larger crystal grain diameters but also reduce the degree of roughening of a film as compared to the annealing only with laser light of a high energy density.

That is, in crystallizing or improving the crystallinity of a thin film of a semiconductor such as silicon by using laser light, it is important in terms of reduction in the degree of film roughening to irradiate the thin film first with laser light of a low energy density and then with laser light of a higher energy density.

However, such multiple-stage laser irradiation has a problem that the annealing process takes loner time than in single-stage laser irradiation.

One method for solving this problem is to make the energy density profile of linear laser light in its line-width direction trapezoidal or Gaussian.

A trapezoidal energy density profile can be obtained by controlling the distance between the final-stage cylindrical lens (focusing lens) and the irradiation surface in an optical system for forming laser light having a rectangular energy density profile which system has a slit.

A Gaussian energy density profile can be obtained by removing a slit or widening the slit in the line-width direction of linear laser light in an optical system for forming laser light having a trapezoidal energy density profile.

If the irradiation surface is irradiated with linear laser light having such a trapezoidal energy density profile while being scanned with it, laser light of a low energy density is applied to the irradiation surface first, and thereafter laser light of an increasingly high energy density is applied.

Therefore, a coating is not irradiated suddenly with laser light of a high energy density unlike the case of using laser light having a rectangular energy density profile. Thus, the coating can be crystallized satisfactorily by single scanning on the entire irradiation surface. Almost the same results are obtained also in the case of using laser light having a Gaussian energy density profile.

When laser annealing is performed by using laser light having a trapezoidal or Gaussian energy density profile, the inventors of the present invention discovered that an annealed semiconductor film is occasionally roughened in a strip-like manner; that is, a plurality of stripes are formed in the longitudinal direction of the linear laser light.

One reason of this stripe-like film roughening is that depending on the energy density profile of laser light, different locations on the irradiation surface may not be irradiated with laser light of the same energy density. This will be explained below with reference to FIGS. 6A–6D, with respect to a case of crystallizing an amorphous silicon film by laser annealing.

FIGS. 6A–6D show a scanning process with linear laser light having a trapezoidal energy density profile. More specifically, FIGS. 6A–6D show a case where linear laser light having a trapezoidal energy density profile which is emitted from a pulsed laser light source such as an excimer laser is moved in the scanning direction by a pitch D for each shot of irradiation. In FIGS. 6A–6D, characters $\alpha'$ and $\beta'$ indicate positions on the irradiation surface and E1 and E2 represent energy density levels (E1<E2).

In a first shot, as shown in FIG. 6A, a laser light having a trapezoidal energy density profile is applied to a portion near position $\alpha'$.

Next, in a second shot, the laser light that is moved by the pitch D is applied as shown in FIG. 6B. The energy density of laser light at position $\alpha'$ is E1. As a result, an amorphous silicon film in the vicinity of position $\alpha'$ is crystallized well.

It is assumed that an amorphous silicon film is crystallized well at the energy density E1, and that the crystallinity of a silicon film obtained by irradiation at the energy density E2 is improved properly.

In the second shot, on the other hand, almost no laser light is applied to a portion in the vicinity of position $\beta'$. (Although actually there is a portion in the vicinity of position $\beta'$ which is irradiated at a low energy density, no change in film quality occurs there because the energy density is much lower than E1.)

In a third shot, laser light that is further moved by the pitch D is applied as shown in FIG. 6C. The energy density of laser light at position $\alpha'$ is E2. As a result, the crystallinity of a crystalline silicon film in the vicinity of position $\alpha'$ is improved.

However, a portion in the vicinity of position $\beta'$ is suddenly irradiated at an energy density higher than E1. As a result, an amorphous silicon film in the vicinity of position $\beta'$ is crystallized but roughened to a large extent.

In a fourth shot, as shown in FIG. 6D, The energy density of laser light at position $\alpha'$ is again E2.

In laser crystallization of a silicon film, the film quality obtained at a certain position of the silicon film is greatly influenced by laser light that is applied there first and has a sufficiently high energy density to change the film quality.

In other words, second application onward to a certain position of laser light whose energy density is approximately the same as or lower than in first application to the same position is not important to the resulting film quality at that position.

Therefore, second application to position α' of laser light having the energy density E2 does not much affect the film quality at that position.

On the other hand, at the time of the fourth shot, the film is already roughened at position β'. Although the crystallinity is improved by the irradiation at the high energy density E2, the resulting film quality at this position becomes different than at other positions.

Thus, the intrasurface uniformity in film quality is impaired, resulting in a problem that a plurality of semiconductor devices formed on the same substrate by using the above silicon film have different characteristics.

In addition, there is a problem of output power variation of a laser light source. A pulsed laser light source (oscillator) produces laser beams of a given energy density at a predetermined frequency (i.e., pulse interval). However, there may occur an event that the output power of the laser light source suddenly decreases. Usually, reduction in output power occurs at a rate of several shots per tens to hundreds of shots. It is rare that output power reduction occurs consecutively.

FIGS. 7A–7D show a scanning process with linear laser light in which the output power of a laser light source varies. As in the case of FIGS. 6A–6D, the energy density profile of laser light in its line-width direction is trapezoidal in FIGS. 7A–7D.

FIGS. 7A–7D show a case where linear laser light having a trapezoidal energy density profile is moved in the scanning direction by a pitch D for each shot of irradiation. In FIGS. 7A–7D, character x' indicates a specific position on the irradiation surface.

In a first shot, laser light is applied as shown in FIG. 7A. It is assumed that in the first shot an output power reduction of the laser light source has caused a reduction ΔE in the energy density of laser light. At this time, almost no laser light is applied to position x'.

It is assumed that also in a second shot a reduction ΔE' in the energy density of laser light as shown in FIG. 7B. At this time, laser light having a very low energy density is applied to position x', and hence almost no crystallization occurs there.

It is assumed that in a third shot laser light having the normal energy density is applied as shown in FIG. 7C. At this time, position x' is suddenly irradiated with laser light having a sufficiently high energy density to effect crystallization, thus roughening the film.

Even if fourth-shot laser irradiation is performed as shown in FIG. 7D, the film quality of the semiconductor thin film is not improved.

That is, although the crystallinity is improved, the film quality is rendered non-uniform.

The above problems occur equally in the case of laser light having a Gaussian energy density profile.

SUMMARY OF THE INVENTION

An object of the present invention is to improve the intrasurface uniformity of an annealed semiconductor thin film in crystallizing or improving the crystallinity of a semiconductor thin film by irradiating, while scanning, it with linear laser light.

Another object of the invention is to anneal a semiconductor thin film uniformly over a substrate surface even if there occurs a reduction in the output power of a laser light source.

According to one aspect of the invention, there is provided a laser irradiation apparatus comprising means for producing linear pulse laser light having a step-like beam profile in a line-width direction, the beam profile including step sections each having a given irradiation energy density and a length $L_n$ in the line-width direction; and means for irradiating an irradiation object with the laser light while scanning the irradiation object with the laser light at a pitch D in the line-width direction, wherein the length $L_n$ and the pitch D satisfies $L_n \geq D$.

According to another aspect of the invention, there is provided a laser irradiation method comprising the steps of producing linear pulse laser light having a step-like beam profile in a line-width direction, the beam profile including step sections each having a given irradiation energy density and a length $L_n$ in the line-width direction; and irradiating an irradiation object with the laser light while scanning the irradiation object with the laser light at a pitch D in the line-width direction, wherein the length $L_n$ and the pitch D satisfies $L_n \geq D$.

In the above laser irradiation apparatus and method, it is preferred that a relationship $L_n \geq 3D$ be satisfied. This is because irradiating a specific location of the irradiation object two or more times with pulse laser light having the same irradiation energy density can prevent a variation in irradiation effect due to a variation in the irradiation energy density of laser light.

To prevent a variation in the irradiation effect of laser light, it is even preferred that a relationship $L_n \geq 5D$ be satisfied.

An example of the step-like beam profile is a profile shown in FIG. 1 which has two steps of irradiation energy densities. In this case, the step sections having the lengths $L_n$ are two sections having lengths L1 and L2. In general, the number of step sections is a natural number that is larger than 1.

In the example of FIG. 1, the beam profile includes a first section having an energy density E1 and a length (in the line-width direction of linear laser light) $L_1=L1$ (n=1) and a second section having an energy density E2 and a length $L_2=L2$ (n=2).

The energy density E1 may be set at a value suitable for rendering the irradiation object into a first state while the energy density E2 may be set at a value suitable for rendering the irradiation object into a second state.

For example, an amorphous silicon film can be crystallized efficiently by irradiation with laser light by setting the energy density E1 at a value suitable for crystallizing the amorphous silicon film and setting the energy density E2 at a value suitable for improving the crystallinity of a crystallized silicon film.

BRIEF DESCRIPTION OF THE DRAWINGS

FIGS. 9A and 9B show another example of an optical system according to the first embodiment;

DETAILED DESCRIPTION OF THE PREFERRED EMBODIMENTS

Figure 1:
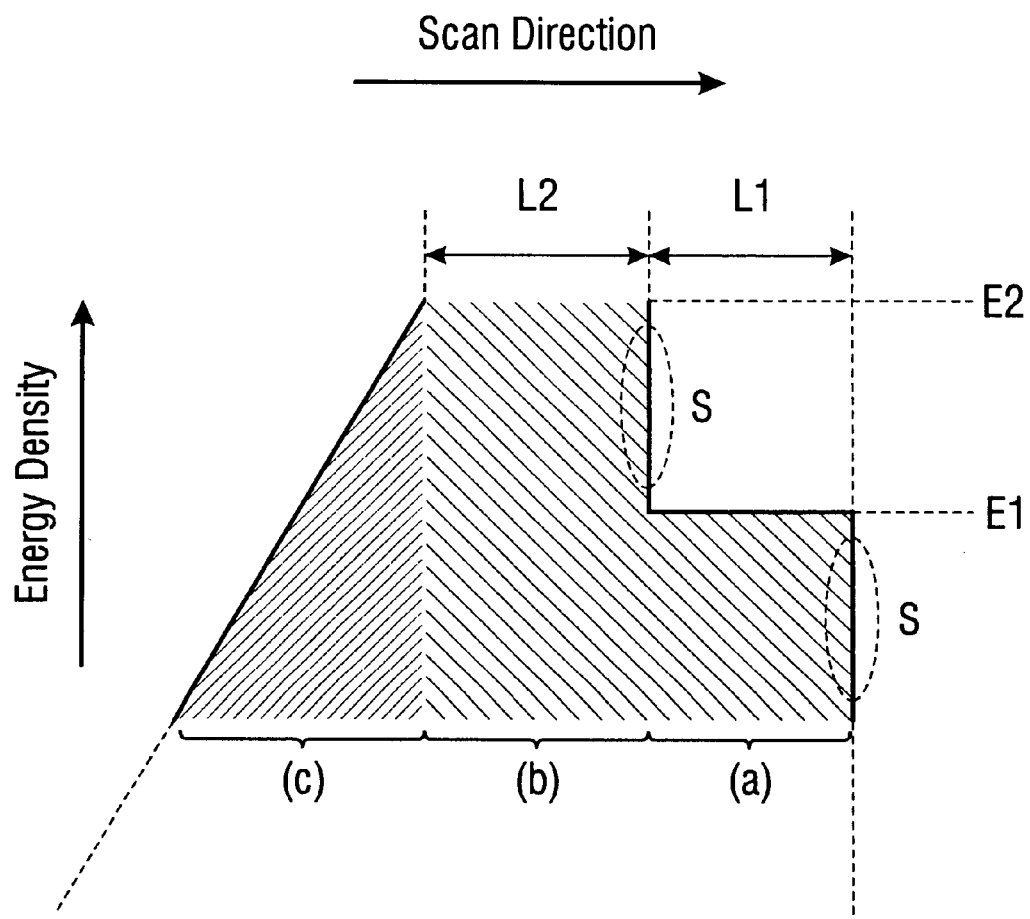
FIG. 1 conceptually shows an energy density profile of linear laser light in its line-width direction.

FIG. 1 conceptually shows an energy density profile of linear laser light in its line-width direction. The present invention employs an energy density profile of linear laser light in its line-width direction which is divided into sections having different energy density levels in a step-like manner as shown in FIG. 1. That is, the energy density profile consists of step-like sections. An irradiation surface is scanned with laser light having such an energy density profile in the line-width direction of the linear laser light (i.e., perpendicularly to its longitudinal direction).

As shown in FIG. 1, laser light at least includes section (a) having an energy density E1 and a width L1 and section (b) having an energy density E2 and a width L2 (E1<E2). For example, E1 is an energy density which enables crystallization of an amorphous silicon film, and E2 is an energy density which causes expansion of crystal grains of a film that was crystallized at the energy density E1.

L1 is a width (i.e., a length in the line-width direction) over which the energy density is approximately equal to E1, and L2 is a width over which the energy density is approximately equal to E2.

It is not always the case that the energy density remains completely equal to E1 or E2 over the width of L1 or L2. That is, each section does not necessarily have a completely flat energy density profile.

Further, the energy density varies to a certain extent due to a small variation in the output power of a laser light source or being influenced by an optical system etc.

In view of the above, in this specification the energy densities E1 and E2 are defined as including a variation range of ±5%. In other words, L1 and L2 are widths over which the energy density remains within the ±5% range.

If the energy density variation range exceeds ±5%, the crystallinity of a laser-irradiated coating is likely rendered non-uniform. As the variation range decreases, the uniformity in crystallinity is increased.

Section (c) is a tail portion of the energy density profile. Section (c) has almost no influences on the quality of an irradiated coating even if it assumes any profile, as long as its energy density is lower than E2.

With the above energy density profile, laser annealing can be performed in a higher degree of uniformity as a leading edge S1 of section (a) and a leading edge S2 of section (b) become steeper, i.e., closer to a vertical line.

Laser irradiation is performed on an amorphous silicon film or a crystalline silicon film by irradiating, while scanning, it with a laser beam having the above profile.

Next, a description will be made of a scanning process of laser annealing with reference to FIGS. 2A–2D. FIGS. 2A–2D show a case where linear laser light having a given energy density profile is moved in the scanning direction by a pitch D for each shot of irradiation. In FIGS. 2A–2D, characters α and β indicate positions on the irradiation surface.

In FIGS. 2A–2D, the pitch D is a relative movement distance in the scanning direction with respect to the laser light irradiation surface for each shot of laser light irradiation.

In the energy density profile of FIGS. 2A–2D, L1 and L2 are twice longer than the pitch D.

Figure 2A:
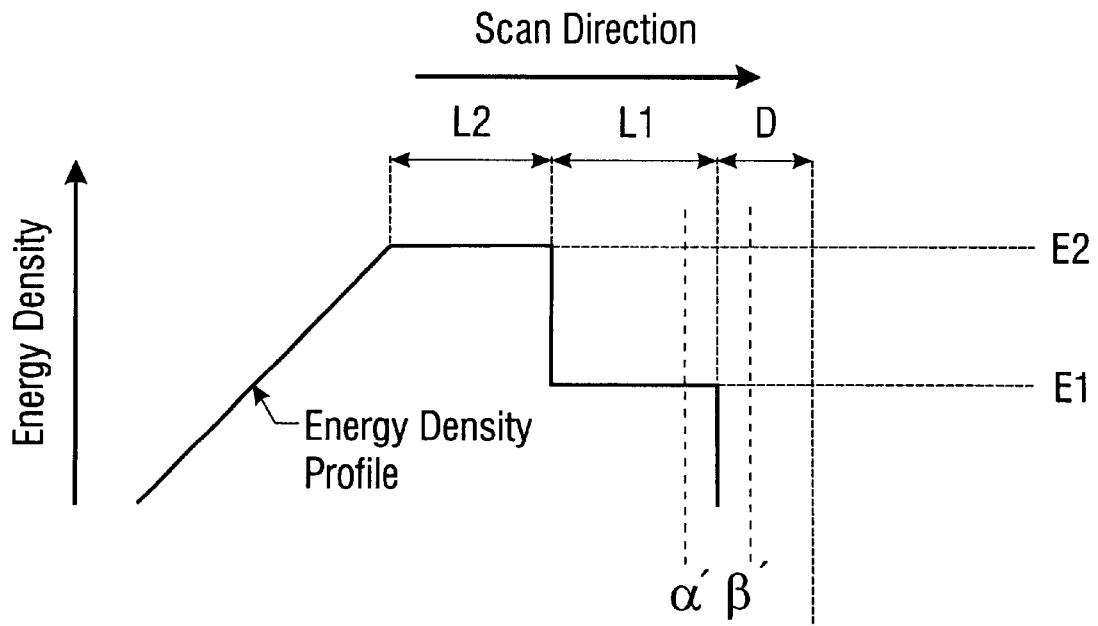
FIGS. 2A–2D show a scanning process.

In a first shot, as shown in FIG. 2A, position a is irradiated with a laser beam portion having an energy density E1.

Figure 2B:
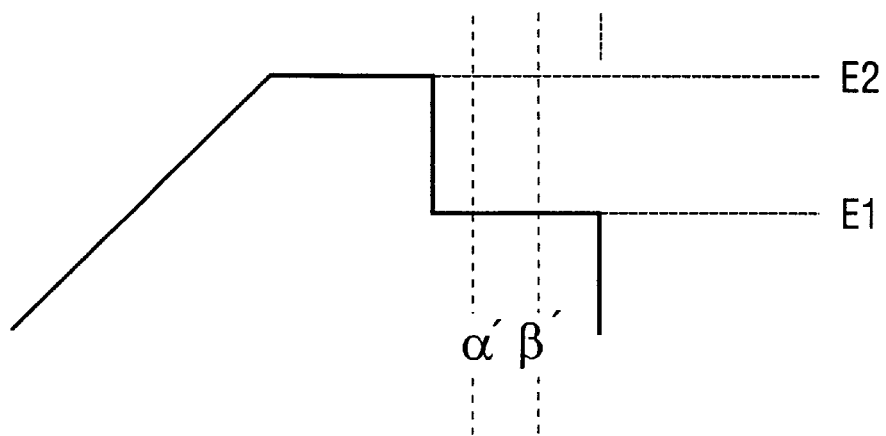

In a second shot, as shown in FIG. 2B, both positions α and β are irradiated with laser beam portions having the energy density E1.

Figure 2C:
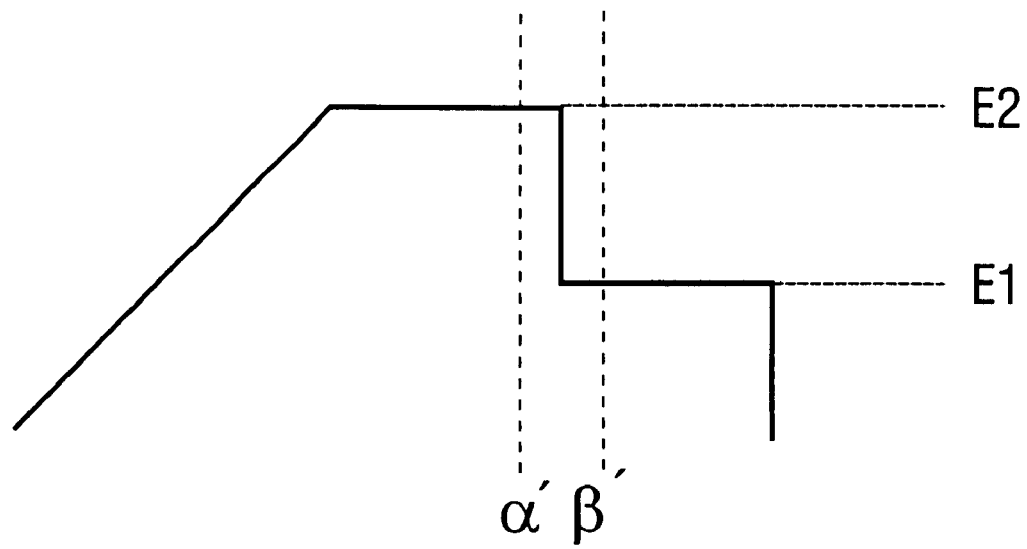

In a third shot, as shown in FIG. 2C; position a is irradiated with a laser beam portion having an energy density E2 while position β is again irradiated with a laser beam portion having the energy density E1.

Figure 2D:
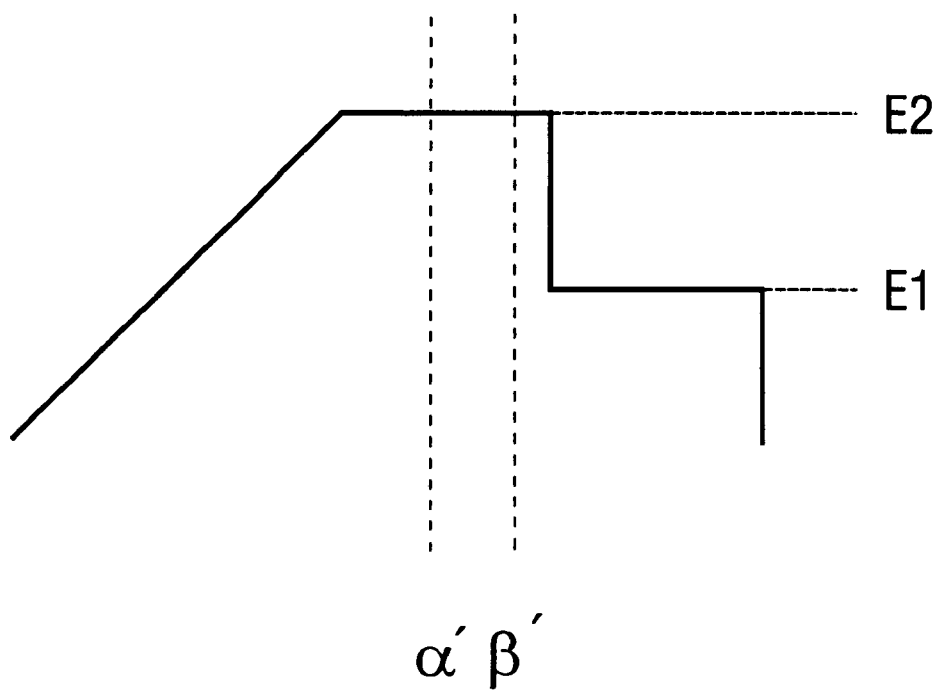

In a fourth shot, as shown in FIG. 2D, both positions α and β are irradiated with laser beam portions having the energy density E2.

As described above, in this example, every position in the scanning direction on the irradiation surface can be irradiated twice with laser beam portions having the energy density E1 and then irradiated twice with laser beam portions having the higher energy density E2.

Therefore, both of the crystallization and the improvement in crystallinity can be attained by single laser light irradiation by performing annealing with laser light having a step-like energy density profile in which, for instance, E1 is set at an energy density suitable for crystallization of an amorphous silicon film and E2 is set at an energy density suitable for improvement in crystallinity of a crystallized silicon film. This means reduction in process time.

In addition, there does not occur an event that a semiconductor thin film is suddenly irradiated with laser light having a high energy density. Therefore, a semiconductor thin film is prevented from being roughened, making it possible to provide a coating that has uniform crystallinity over a substrate surface.

Next, a description will be made of a case where the energy density of laser light that is emitted from a laser light source varies suddenly.

FIGS. 4A–4D show a scanning process in which the energy density of laser light varies suddenly. FIGS. 4A–4D show a case where linear laser light having a given energy density profile is moved in the scanning direction by a pitch D for each shot of irradiation. In FIGS. 7A–7D, character x indicates a specific position on the irradiation surface.

In FIGS. 4A–4D, the energy density profile is the one shown in FIG. 1 and L1 and L2 are four times longer than the pitch D.

Figure 4A:
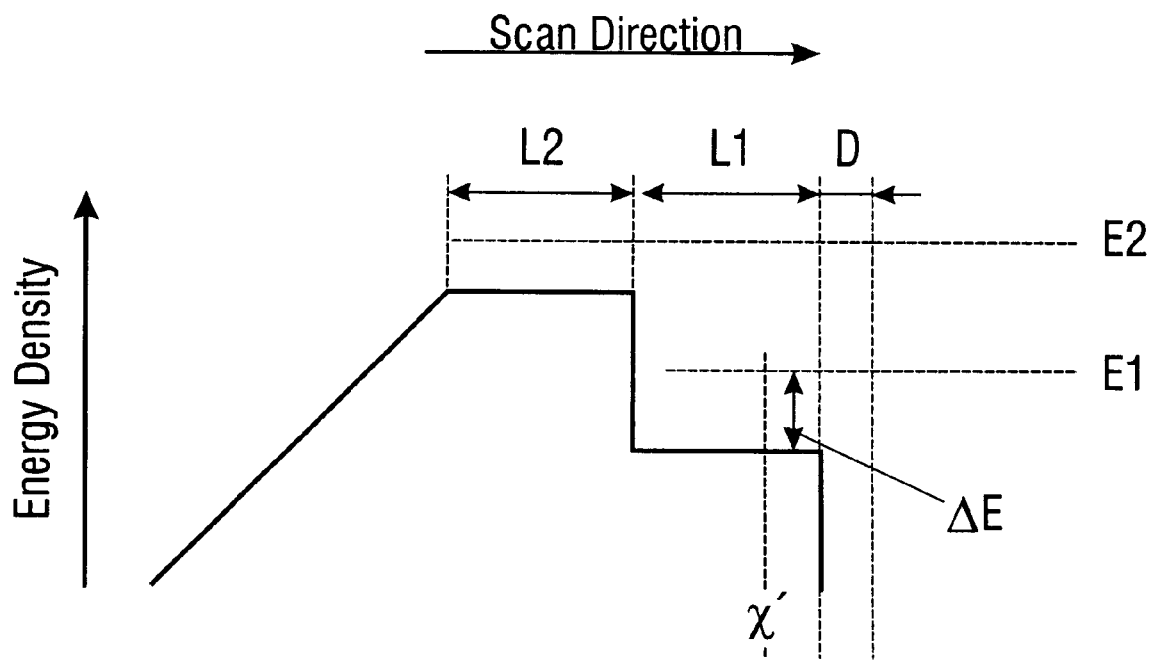
FIGS. 4A–4D show a scanning process in which the laser light energy density varies suddenly.

In a first shot, laser light is applied to position x as shown in FIG. 4A. It is assumed that the laser light energy density has dropped by ΔE due to output power variation of the laser light source. Therefore, position x is irradiated with a laser beam portion having an energy density E1−ΔE.

Figure 4B:
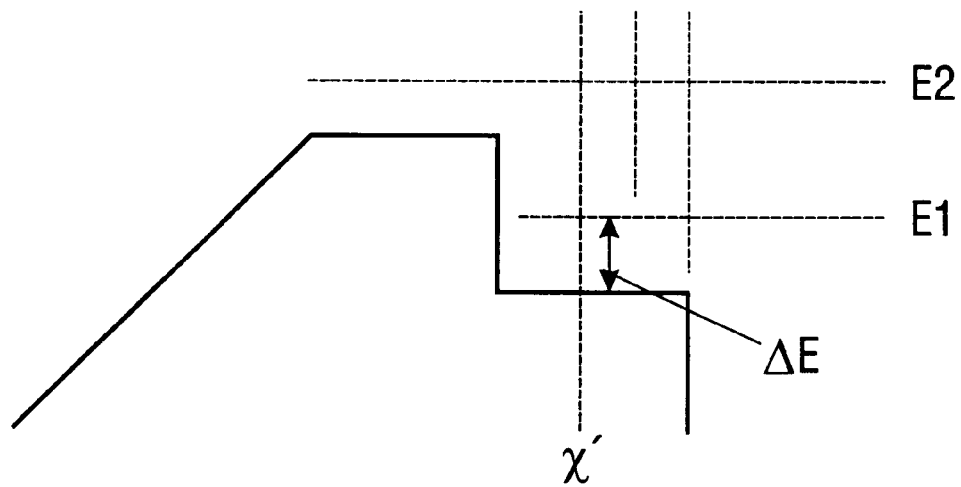

It is assumed that also in a second shot position x is irradiated with a laser beam portion having a reduced energy density E1−ΔE' as shown in FIG. 4B.

The energy applied in each of the first and second shots is insufficient for crystallization of an amorphous silicon or improvement in crystallization. As a result, almost no crystallization occurs in a coating in the first and second shots.

Figure 4C:
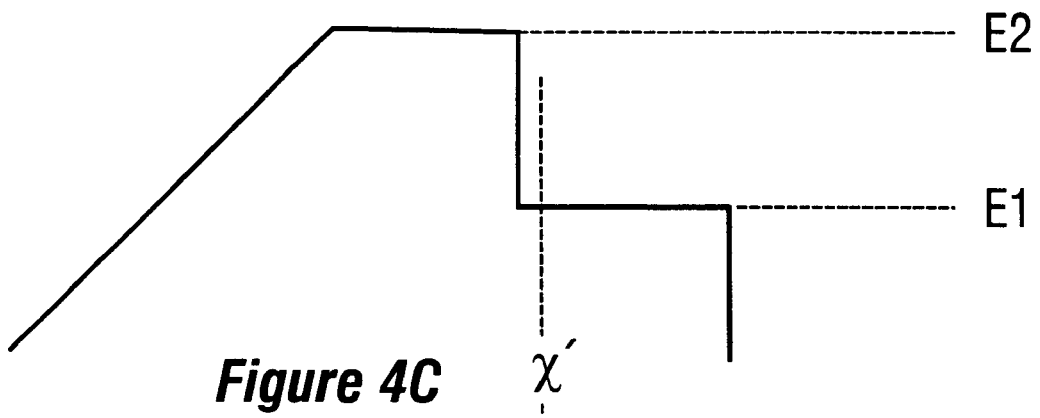

In a third shot, as shown in FIG. 4C, position x is irradiated with a laser beam portion having the normal energy density E1. Therefore, at this time, a semiconductor (amorphous silicon) thin film in the vicinity of position x is crystallized properly.

That is, the semiconductor thin film is not roughened even if it is irradiated with a laser beam portion having the normal energy density after it was irradiated with a laser beam portion whose energy density was reduced due to output power reduction of the laser light source.

Figure 4D:
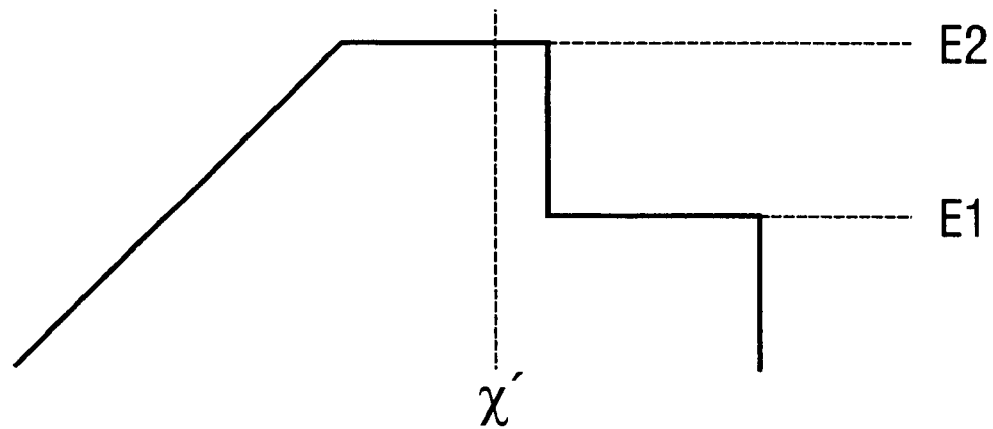

In a fourth shot, as shown in FIG. 4D, position x is irradiated with a laser beam portion having an energy density E2 which is suitable for improvement in crystallinity.

Since crystallization has already been effected by the laser beam portion having the energy density E1 in the third shot, the crystallinity is improved by irradiation with the laser beam portion having the higher energy density E2. There occurs no film roughening. Thus, the semiconductor thin film can be crystallized uniformly over a substrate surface.

As described above, laser light having a step-like energy density profile shown in FIG. 1 is used, and the laser light scanning pitch D is so set that laser beam portions that should have the same energy density are applied to the same position plural times.

If a laser beam portion having the normal energy density is applied at least once among plural times of irradiation, it can be prevented that a sudden reduction in the output power of the laser light source causes non-uniform crystallization.

The number of times at which the same position is irradiated with laser beam portions having the same energy density may be determined in accordance with the probability of output power variation of a laser light source. As the number increases, uniform crystallization is more secured but the annealing process time is increased.

The lengths L1 and L2 in the line-width direction of the respective energy densities are determined in accordance with -required annealing characteristics. L1 and L2 may be either equal to or different from each other.

By controlling L1 or L2, the energy applied to a semiconductor film by laser beams of each energy density can be controlled. Linear laser light is very short in its line-width direction. Therefore, the fact that the most effective annealing condition can be obtained by controlling the lengths L1 and L2 is much favorable for improvement of productivity.

As described above, using the step-like energy density profile according to the invention in a laser annealing step with linear laser light provide the following great advantages:

A semiconductor thin film is given a high degree of crystallinity by single scanning.

An annealed semiconductor thin film is given superior intrasurface uniformity.

The intrasurface uniformity of a semiconductor thin film is not impaired even at the occurrence of a sudden reduction in the output power of a laser light source.

The laser annealing method according to the invention provides much favorable results if the output power of a laser light source has a stability of ±5%

In the laser annealing method of the invention, it is very important that the pitch D (see FIG. 2A) satisfy D≦L1 and D≦L2. If the pitch D is longer than L1 or L2, there occurs in the irradiation surface a region which is not irradiated with any laser beam portion having the energy density E1 or E2. This results in roughening of a coating or intrasurface non-uniformity.

Figure 5:
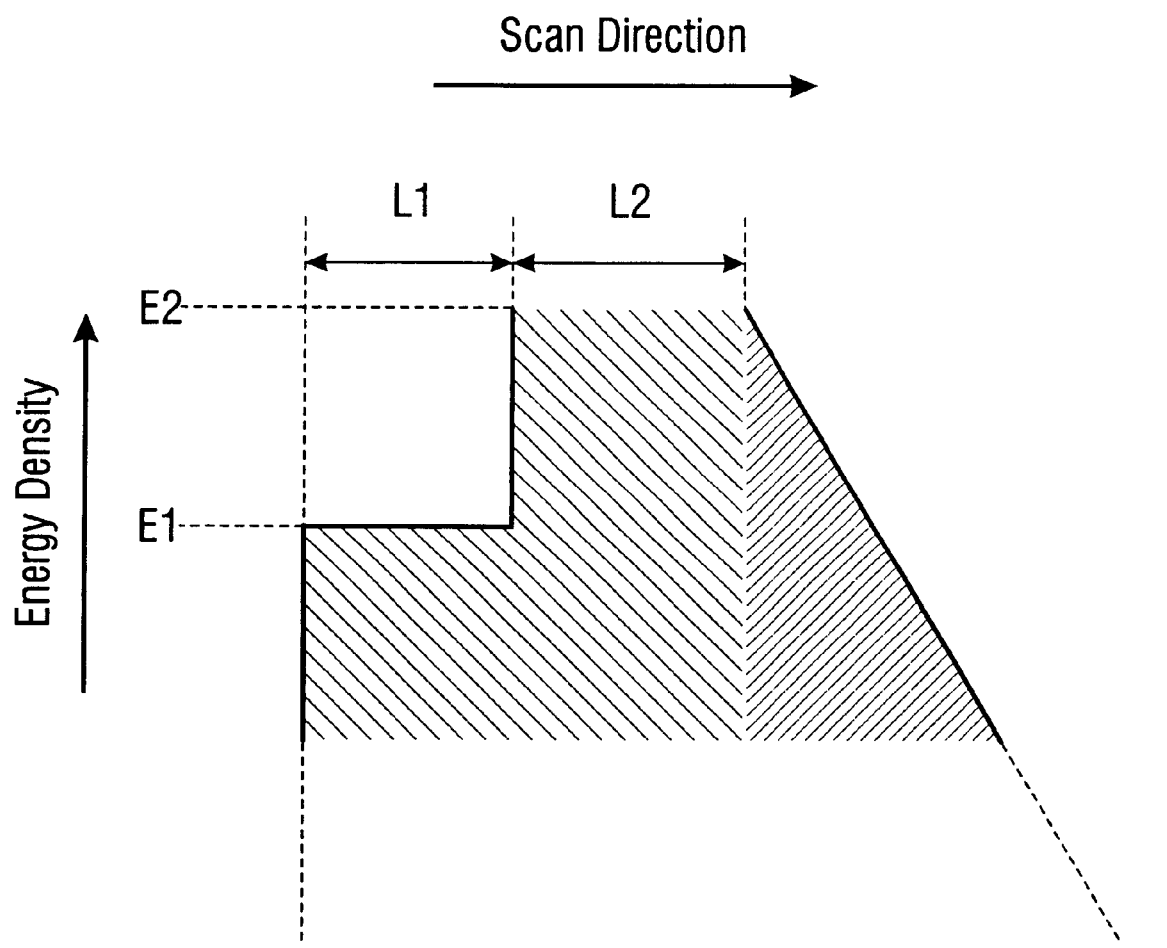
FIG. 5 shows an energy density profile in which a leading portion has a higher energy density.
Figure 6A:
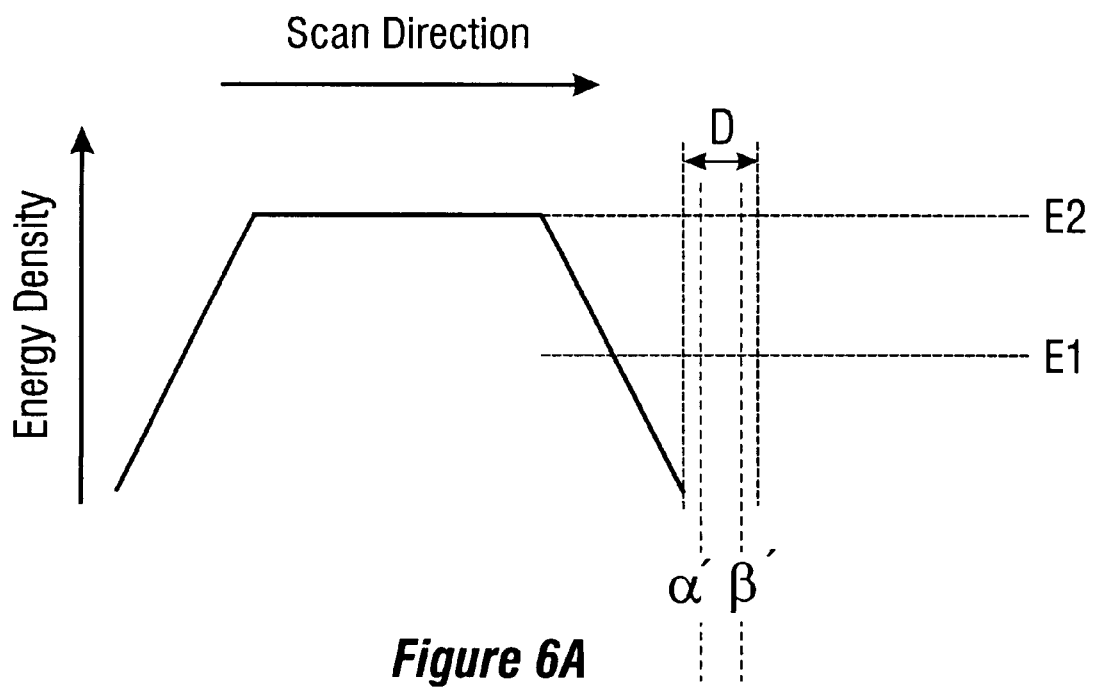
FIGS. 6A–6D show a scanning process with linear laser light having a trapezoidal energy density profile.
Figure 6B:
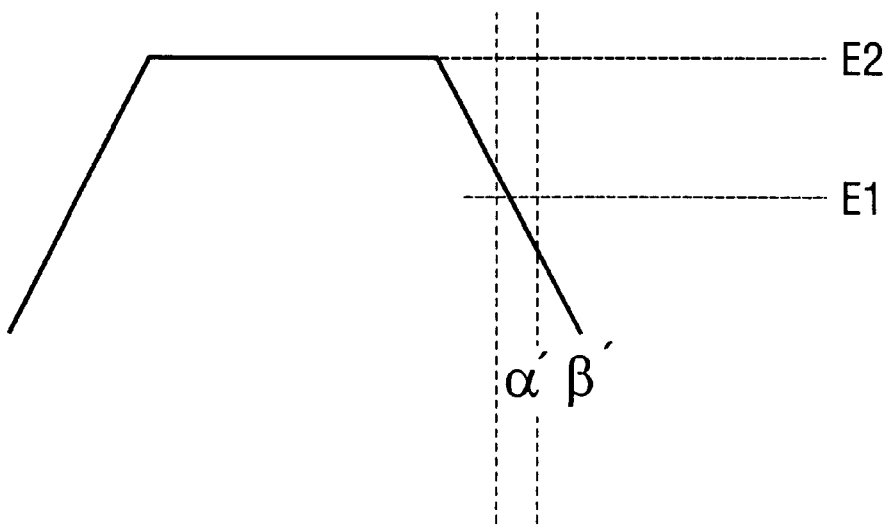
Figure 6C:
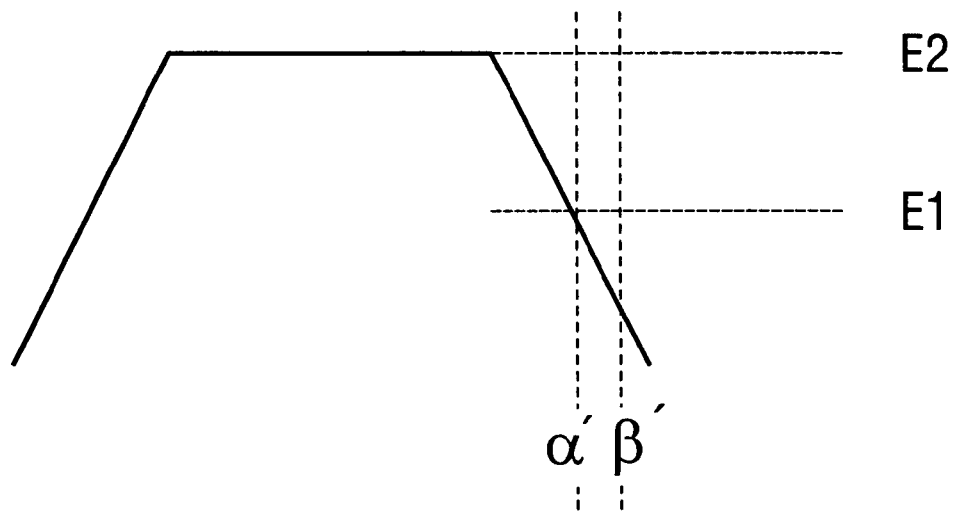
Figure 6D:
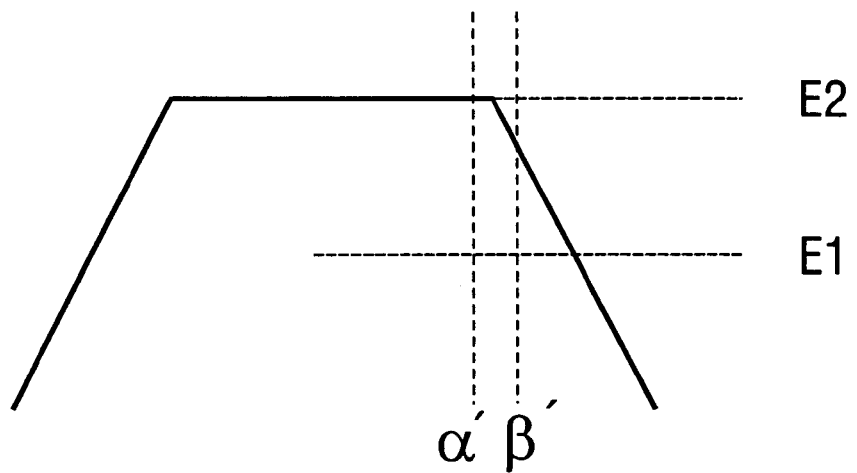
Figure 7A:
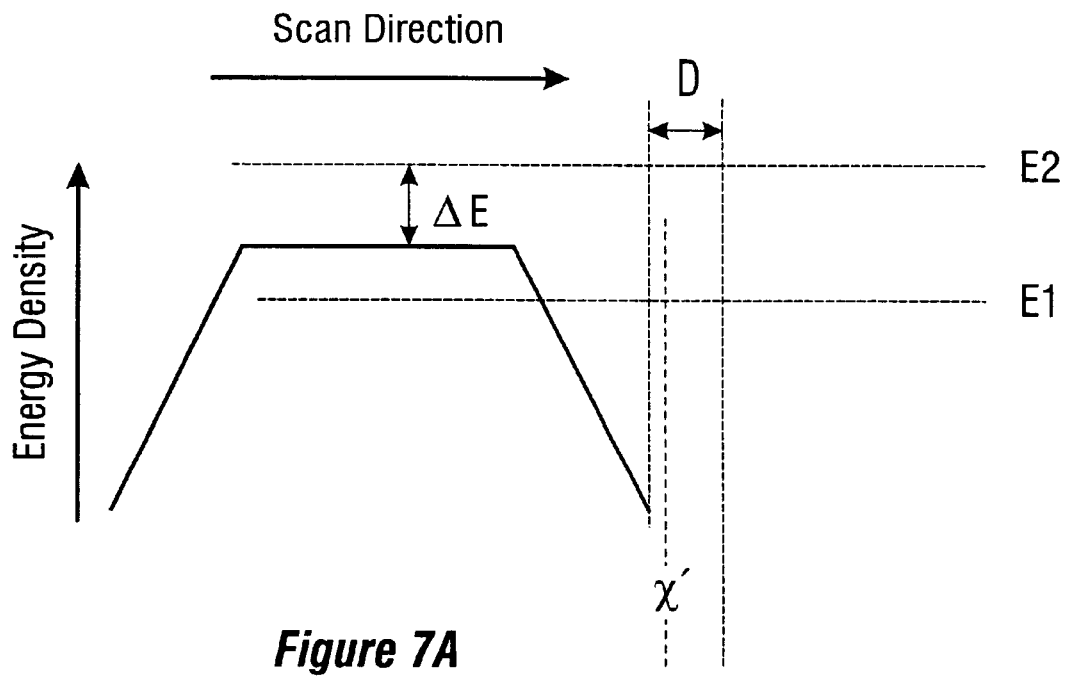
FIGS. 7A–7D show a scanning process with linear laser light in which the output power of a laser light source varies.
Figure 7B:
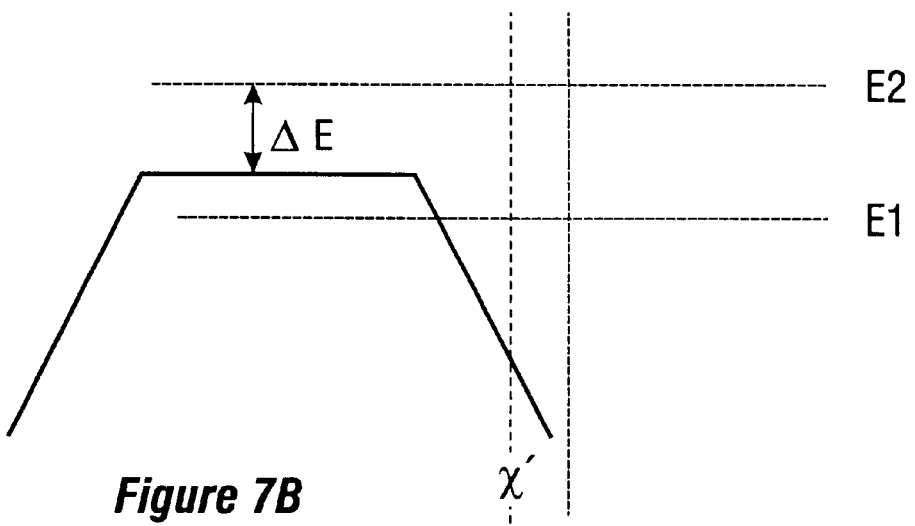
Figure 7C:
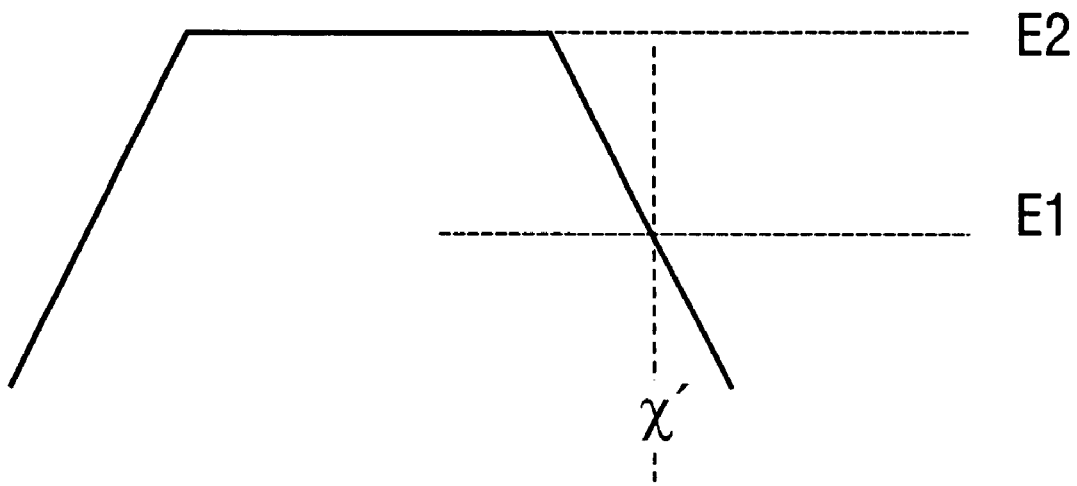
Figure 7D:
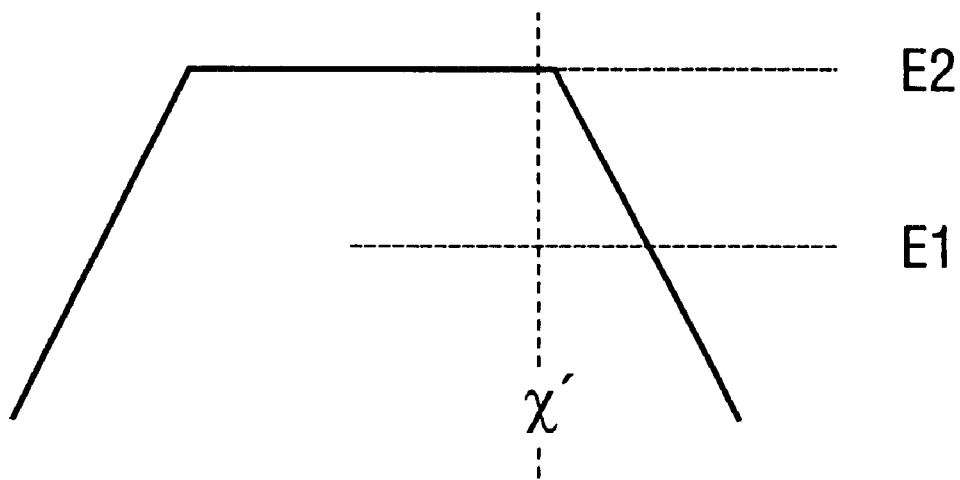

Although the above description is directed to the case where the step-like energy density profile is such that a leading portion has a lower energy density, in some cases an energy density profile in which a leading portion has a higher energy density as shown in FIG. 5 is possible.

Although in the above description the step-like energy density profile includes the two kinds of energy densities E1 and E2, it may include three or more kinds of energy densities.

Embodiment 1

This embodiment is directed to a method for producing a step-like energy density profile on the irradiation surface.

Figure 3:
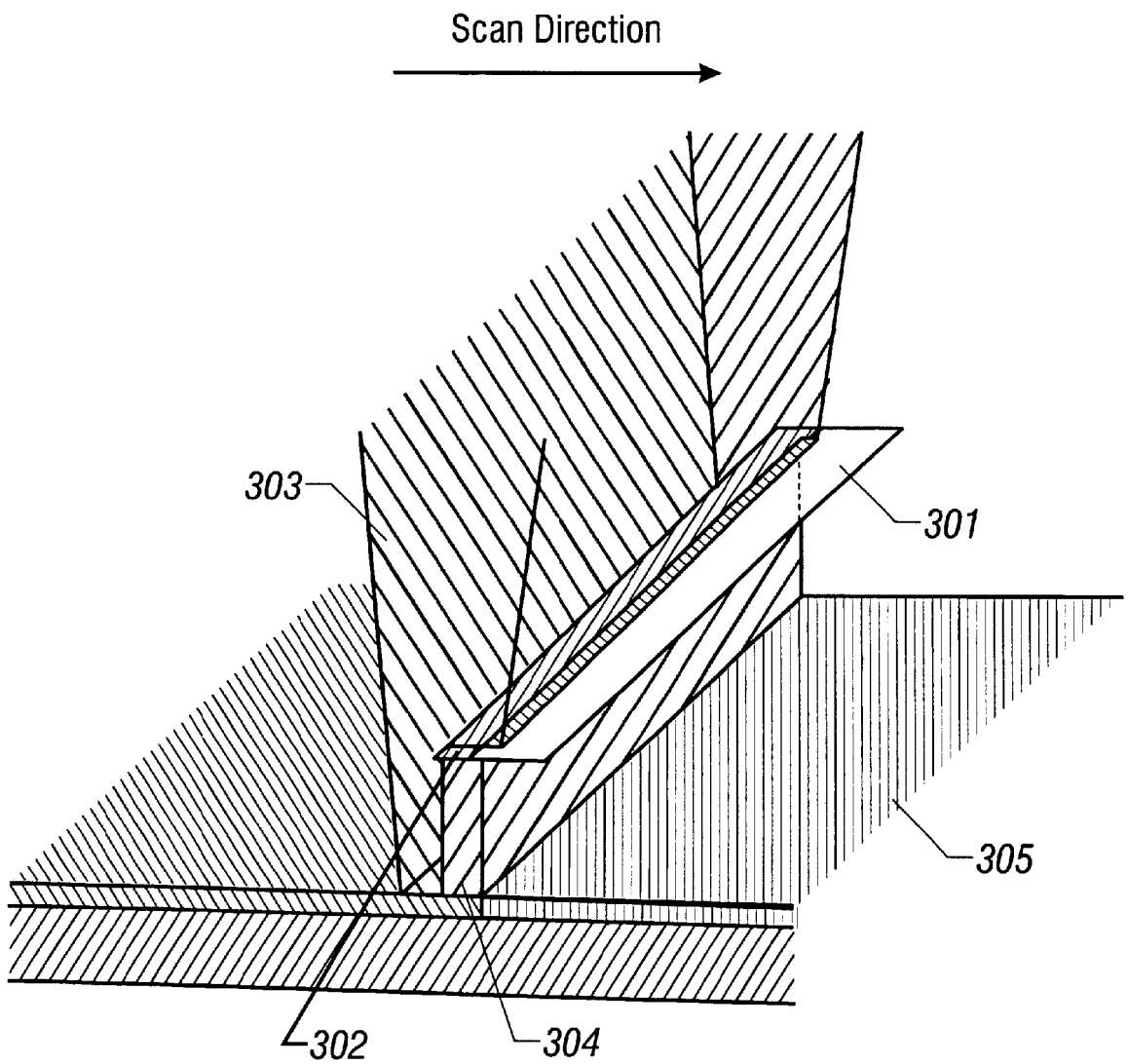
FIG. 3 illustrates a method for producing a step-like energy density profile according to a first embodiment of the present invention.

FIG. 3 illustrates a method for producing the step-like energy density profile as shown in FIG. 1. In this method, the step-like energy density profile is obtained by processing, with an attenuation filter, laser light having a flat-top energy density profile.

To produce a step-like energy density profile on the laser light irradiation surface, in a first step, laser light as emitted from a laser light source is passed through an optical system to shape it into linear laser light having a trapezoidal or Gaussian energy density profile. The energy density profile of the resulting linear laser light is then changed by using a mask and an attenuation filter.

FIG. 3 shows a mask 301 and an attenuation filter 302 that are connected to each other.

The mask 301 makes the leading edge of the energy density profile of laser light 303 steeper. The attenuation filter 302 has a width (i.e., a length in the scanning direction) that is necessary to obtain the width L1 (see FIG. 1).

Laser light 304 that has passed through the attenuation filter 302 and hence has a reduced energy density is applied to an irradiation surface 305. On the other hand, laser light 303 that has not impinged on the attenuation filter 302 is applied to the irradiation surface as it is.

As a result, the laser light that is applied to the irradiation surface 305 has the step-like energy density profile as shown in FIG. 1.

The mask 301 and the attenuation filter 302 are inserted between a final-stage convex lens and the irradiation surface in the optical system for producing a trapezoidal or Gaussian energy density profile.

It is preferred that the mask 301 and the attenuation filter 302 be located as close to the irradiation surface 305 as possible. This is because such an arrangement can make the leading edge of the energy density profile steeper. However, it is necessary that the mask 301 be sufficiently separated from the irradiation surface 305 to avoid influences of diffraction light.

FIGS. 8A and 8B and FIGS. 9A and 9B show examples of optical systems for shaping laser light as output from a laser light source into light having a trapezoidal or Gaussian energy density profile.

Figure 8A:
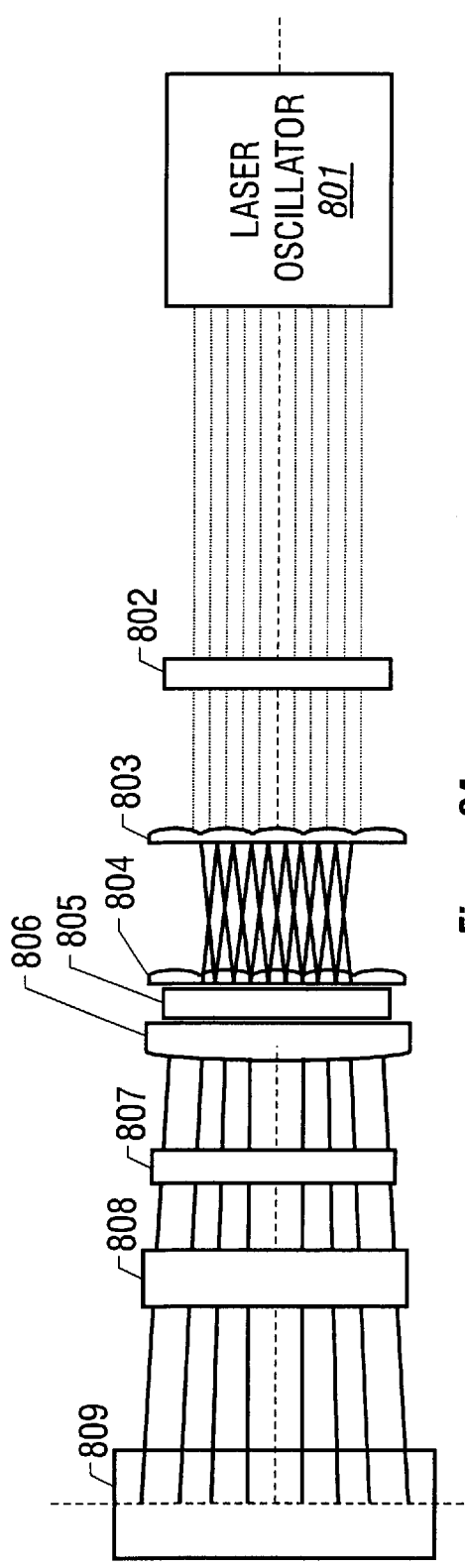
FIGS. 8A and 8B show an example of an optical system according to the first embodiment.
Figure 8B:
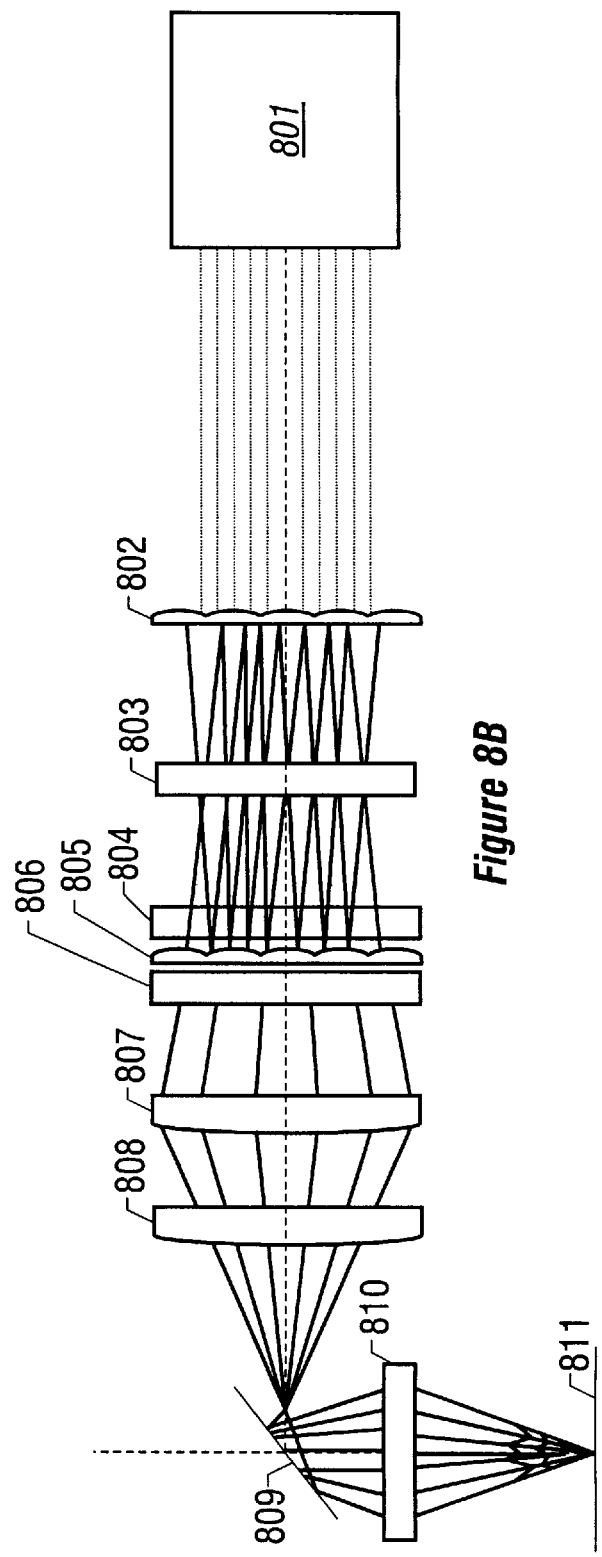

Each of FIGS. 8A and 8B and FIGS. 9A and 9B is an example of the configuration of an optical system for expanding and making uniform laser light as output from a laser light source, then converging resulting 5 laser light into linear light, and finally applying it onto an irradiation surface. FIGS. 8A and 9A are top views of the optical systems, and FIGS. 8B and 9B are side views thereof.

In the optical system of FIGS. 8A and 8B, laser light as emitted from a laser oscillator 801 is expanded and made uniform through passage of a homogenizers 802–805 and convex lenses 806 and 807. Resulting laser light is shaped by a cylindrical lens 808 into linear light, which is reflected by a mirror 809 and then applied to an irradiation surface 811 via a cylindrical lens 810. The cylindrical lens 810 serves for focus control.

In the optical system of FIGS. 9A and 9B, laser light as emitted from a laser oscillator 901 is expanded and made uniform through passage through a beam expander that consists of a concave lens 902 and a convex lens 903 and homogenizers 904 and 905. Resulting laser light is shaped by cylindrical lenses 906 and 907 into linear light, which is reflected by a mirror 908 and then applied to an irradiation surface 910 via a cylindrical lens 909. The cylindrical lens 909 serves for focus control. The number of homogenizers may be an odd number such as 3, 5, or 7, or an increased even number such as 6, 8, or 10.

Either of the optical systems of FIGS. 8A and 8B and FIGS. 9A and 9B can make the top of the laser light energy density profile extremely flat on the irradiation surface.

The laser oscillator (laser light source) may be a large-power pulsed laser oscillator, examples of which are excimer lasers such as an XeCl excimer laser (wavelength: 308 nm) and a KrF excimer laser (wavelength: 248 nm).

In the above optical systems, the laser light energy density profile on the irradiation surface can be made approximately trapezoidal by properly controlling the distance between the final-stage cylindrical lens and the irradiation surface. The profile can be made closer to a trapezoidal form by causing laser light to pass through a slit that is additionally inserted between the final-stage cylindrical lens and the irradiation surface.

If a slit is used instead of the mask 301 in FIG. 3, the trailing edge of the energy density profile can be made steeper. However, the shape of a tail portion of the energy density profile need not be restricted because it does not affect the crystallization.

Embodiment 2

Figure 10A:
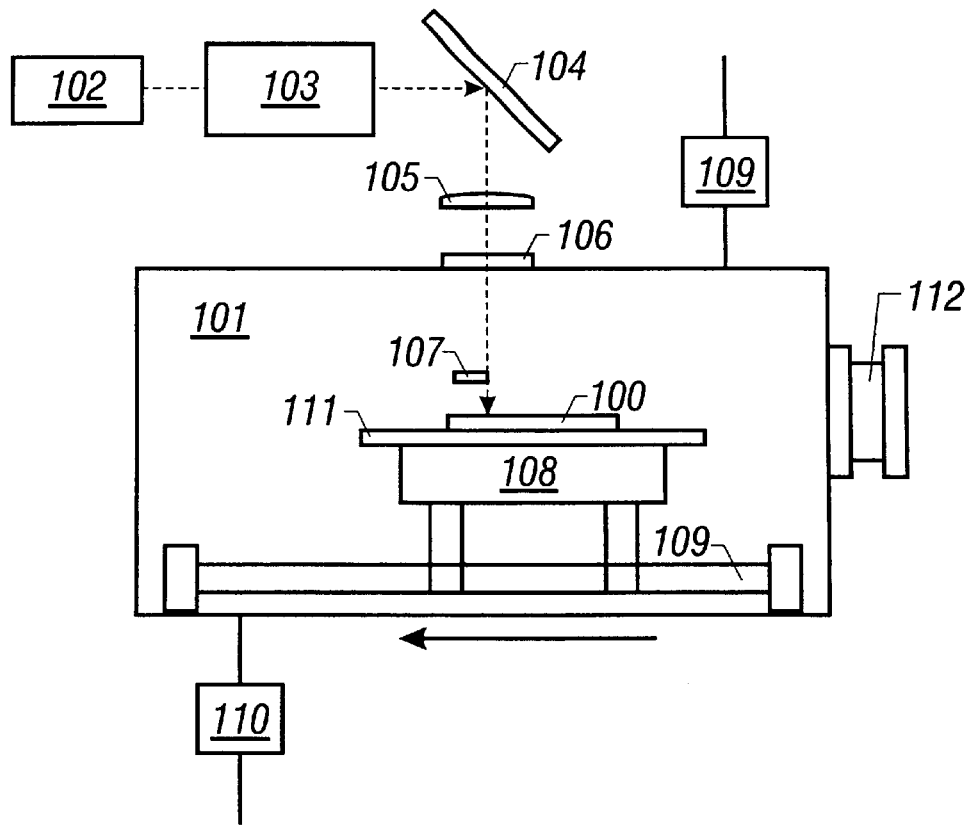
FIGS. 10A and 10B show the configuration of a laser irradiation apparatus according to a second embodiment of the invention.
Figure 10B:
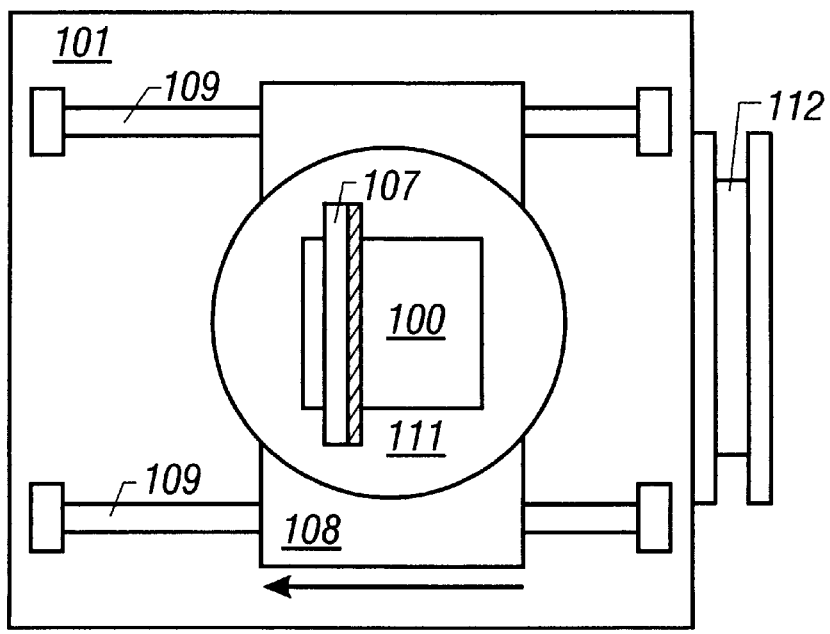

This embodiment is directed to a laser irradiation apparatus. FIGS. 10A and 10B show the configuration of a laser irradiation apparatus.

In FIGS. 10A and 10B, reference numeral 101 denotes a laser irradiation chamber, which can be isolated from the external environment and kept in a low-pressure state.

Laser light is emitted from a laser light source (oscillator) 102, and shaped by an optical system 103 into light having a linear crosssection, which is reflected by a mirror 104 and then applied to a substrate 100 to be processed via a focus-adjusting convex lens (cylindrical lens) 105 and a quartz window 106. The components 102–105 correspond to the laser light source and the optical system of FIGS. 8A and 8B or FIGS. 9A or 9B of the first embodiment.

The substrate 100 to be processed is placed on a stage 111 that is provided on a base 108, and its temperature is kept at a given value (room temperature to 700° C. preferably 100°–500° C.) by a heater that is incorporated in the base 108.

The base 108 is moved by a moving mechanism perpendicularly to the longitudinal direction of linear laser light, to allow the top surface of the substrate 100 to be irradiated, while being scanned, with the laser light.

Since the laser irradiation chamber 101 is equipped with a vacuum pump 110, its inside can be rendered in a low-pressure or vacuum state.

The laser irradiation chamber 101 has a gas supply section 109. The gas supply section 109 serves to form a desired atmosphere by introducing a gas such as oxygen, nitrogen, or helium into the laser irradiation chamber 101. If necessary, another gas supply section may be provided to introduce a different gas.

Having a gate valve 112, the laser irradiation chamber 101 can be connected to another processing chamber. When necessary, a substrate (sample) can be input or output through the gate valve 112.

A multi-chamber configuration may be employed in which a substrate transfer chamber, a heating chamber, a slow cooling chamber, a load/unload chamber, etc. are arranged via gate valves 112.

Held by a fixing means (not shown), a mask/attenuation filter 107 as shown in FIG. 3 is disposed above the substrate 100 to be processed. The attenuation filter is connected to the mask.

The mask interrupts a leading portion of linear laser light transmitted through the window 106 (the scanning direction is indicated by an arrow in FIGS. 10A and 10B), whereby the leading edge of the energy density profile of the linear laser light can be made steeper.

The attenuation filter reduces the energy density of a leading portion of the linear laser light.

With the laser irradiation apparatus having the above configuration, the laser annealing using laser light having a step-like energy density profile can be performed with high quality and high productivity.

Embodiment 3

This embodiment is directed to a manufacturing process for forming a thin-film transistor on a glass substrate.

FIGS. 11A–11F show a manufacturing process according to this embodiment. First, a 127-mm-square Corning 1737 substrate is prepared as a substrate 1101 to be processed.

A 2,000 Å-thick silicon oxide film 1102 as an undercoat film is formed on the substrate 1101 by plasma CVD. An amorphous silicon film (not shown) having a thickness of 500–1,000 Å, for instance, 500 Å, is formed thereon by low-pressure CVD.

Next, a nickel acetate solution of about 10 ppm is applied to the amorphous silicon film by spin coating to establish a state that nickel is held in contact with the surface of the amorphous silicon film. Details of the crystallization technique using nickel are described in Japanese Unexamined Patent Publication (Laid-Open) No. 6-244104, which in turn corresponds to pending U.S. patent application Ser. No. 08/636,819.

In this state, a heat treatment is performed for four hours at 450°–600° C. for instance, 600° C., in a hydrogen-containing atmosphere (i.e., a reducing atmosphere). In the course of this heating treatment, the amorphous silicon film is crystallized, i.e., converted into a crystalline silicon film (see FIG. 11A).

It is desirable that the concentration of nickel finally remaining in the film fall within a range of $1 \times 10^{15}$ to $5 \times 10^{19}$ atoms/cm$^3$.

Thus, the crystalline silicon film 1103 is obtained. To improve the crystallinity of the crystalline silicon film 1103, laser annealing is performed next.

The laser annealing is performed by using the apparatus of FIGS. 10A and 10B and the optical system of FIGS. 8A and 8B. The annealing is conducted at the atmospheric pressure in an oxygen-containing atmosphere.

The laser annealing is performed in a state that the temperature of the substrate 1101 is increased to 200° C. by heating. Linear laser light to be applied has an approximate size of 0.3 mm (width)×135 mm (length) on the irradiation surface when neither a mask nor an attenuation filter is inserted.

Laser light is given a step-like energy density profile as shown in FIG. 1 by using the mask 301 and the attenuation filter 302 shown in FIG. 3. The attenuation filter 302 has a width of 0.1 mm in the scanning direction.

The step-like energy density profile of laser light is set as follows in terms of the symbols of FIG. 1: $E1=150$ mJ/cm$^2$, $E2=280$ mJ/cm$^2$, and $L1=L2=0.1$ mm.

The energy density E1 is set in a range of properly starting crystallization of an amorphous silicon film. A typical range is 100 mJ/cm$^2 \leq E1 \leq 250$ mJ/cm$^2$.

The energy density E2 is set in a range of properly improving the crystallinity of a silicon film that has been irradiated at the energy density E1. A typical range is 200 mJ/cm$^2 \leq E2 < 300$ mJ/cm$^2$.

Each of the energy densities E1 and E2 may include a variation range of ±5%.

Linear laser light is interrupted by the mask 301 over a width of about 0.1 mm in the line-width direction. As a result, the leading edge of the energy density profile of laser light is made steeper.

Laser light having the energy density E1 has a role of preliminarily heating a crystalline silicon film. Laser light having the energy density E2 has a role of improving the crystallinity, such as increasing crystal grain sizes, of the entire crystalline silicon film that has been subjected to the preliminary heating.

In connection with L1 and L2, the pitch D of the scanning with laser light is set at 0.025 mm. As a result, the same location is irradiated with laser light of the same energy density E1 or E2 four times (0.1 mm/0.025 mm=4).

In a laser annealing experiment that was performed under the above conditions, the crystallinity was sufficiently improved by one scanning. Further, in spite of unavoidable sudden decreases of 5–10% in the output power of a laser light source, the surface of the crystalline silicon film 1103 as annealed was extremely uniform without any stripe-like roughening (see FIG. 11B).

Next, a thin-film transistor (TFT) is formed by using the crystalline silicon film 1103 that has been improved in crystallinity by the laser annealing. First, the crystalline silicon film 1103 is etched into an island-like region 1104, which will constitute the active layer of a thinfilm transistor.

Figure 11A:
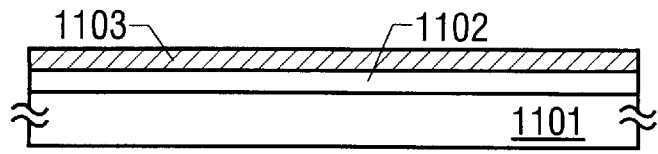
FIGS. 11A–11F show a manufacturing process according to a third embodiment of the invention.
Figure 11B:
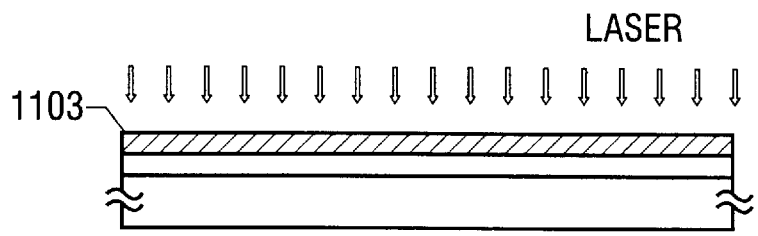
Figure 11C:
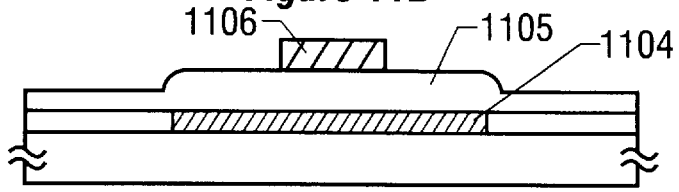

A 1,200 Å-thick silicon oxide film as a gate insulating film 1105 is formed on the above structure by plasma CVD by using a material gas of TEOS (see FIG. 11C).

Next, a gate electrode is formed in the following manner. First, a 6,000 Å-thick aluminum film (not shown) is formed by sputtering. The aluminum film is caused to contain scandium or silicon at 0.1–2.0 wt %. The aluminum film is etched into a gate electrode 1106.

Impurity ions are then implanted to form source and drain regions. In this embodiment, to form an n-channel TFT, P (phosphorus) ions are implanted by ion doping with the gate electrode 1106 used as a mask. As for the doping conditions, phosphine (PH$_3$) is used as a doping gas and the acceleration voltage and the dose are set at 80 kV and 1×10$^{15}$ atoms/cm$^2$, respectively. The substrate temperature is set at the room temperature.

Incidentally, in the case of implanting B (boron) ions to form a p-channel TFT, diborane (B$_2$H$_6$) diluted with hydrogen to about 5% is used as a doping gas and the acceleration voltage and the dose are set at 65 kV and 3×10$^{15}$ atoms/cm$^2$, respectively. The substrate temperature is set at the room temperature.

Figure 11D:
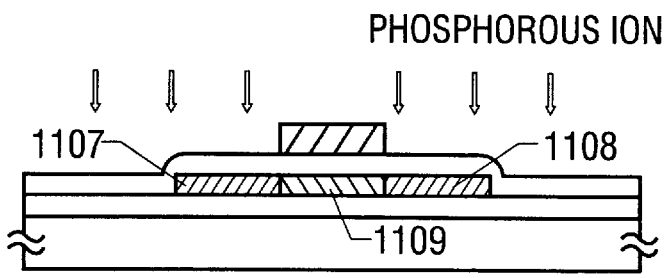
Figure 11E:
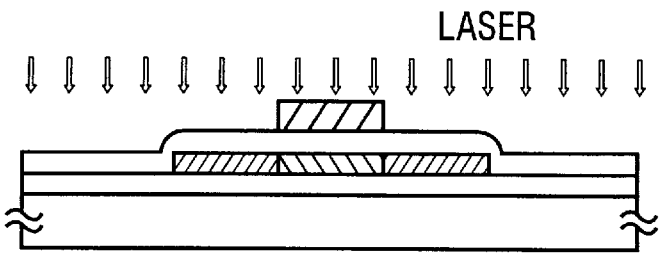

By this doping step, a channel forming region 1109 and impurity regions of a source region 1107 and a drain region 1108 are formed in a self-aligned manner (see FIG. 11D).

Subsequently, laser annealing is performed to activate the implanted impurity. Also in this step, linear laser light having a step-like energy density profile is used.

The step-like energy density profile of laser light is set as follows in terms of the symbols of FIG. 1: $E1=150$ mJ/cm$^2$, $E2=200$ mJ/cm$_2$, and $L1=L2=0.1$ mm. The other conditions are set the same as in the above-described crystallization step.

As a result of this laser annealing, the impurity is activated as well as damage caused by the impurity ion implantation is repaired. After the laser annealing, thermal annealing is performed at 450° C. for 2 hours in a nitrogen atmosphere (see FIG. 11E).

Next, a 6,000 Å-thick silicon oxide film as an interlayer insulating film 1110 is formed by plasma CVD.

After contact holes are formed through the interlayer insulating film 1110, a source electrode 1111 and a drain electrode 1112 are formed with a metal material; for instance, a multilayer film of titanium and aluminum is formed.

Figure 11F:
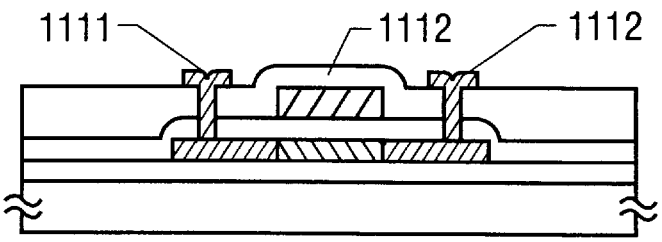

Finally, thermal annealing is performed at 200°–350° C. in a hydrogen atmosphere of 1 atm, to complete a thin-film transistor (see FIG. 11F).

A plurality of crystalline silicon thin-film transistors are formed in the above manner.

A plurality of thin-film transistors formed according to this embodiment showed much smaller variations, over the same substrate surface, in various characteristics such as the threshold voltage and the mobility than in the case of using a rectangular or trapezoidal energy density profile in the laser annealing step for improving the crystallinity.

Embodiment 4

This embodiment is directed to a case of forming a crystalline silicon film by laser-annealing an amorphous silicon film.

First, a 127-mm-square, 1.1-mm-thick Corning 1737 substrate is prepared. A 2,000 Å-thick silicon oxide film as an undercoat film is formed on the substrate by plasma CVD.

An amorphous silicon film having a thickness of 500–1, 000 Å, for instance, 500 Å, is formed thereon by low-pressure CVD.

Next, laser annealing is performed in the following manner. The laser annealing is performed by using the apparatus of FIGS. 10A and 10B and the optical system of FIGS. 9A and 9B. The annealing is conducted at the atmospheric pressure in an oxygen-containing atmosphere.

The laser annealing is performed in a state that the temperature of the substrate 1101 is increased to 200° C. by heating. Linear laser light to be applied has an approximate size of 0.7 mm (width)×135 mm (length) on the irradiation surface when neither a mask nor an attenuation filter is inserted.

Laser light is given a step-like energy density profile as shown in FIG. 1 by using the mask 301 and the attenuation filter 302 shown in FIG. 3. The attenuation filter 302 has a width of 0.3 mm in the scanning direction.

The step-like energy density profile of laser light is set as follows in terms of the symbols of FIG. 1: $E1=130$ mJ/cm$^2$, $E2=250$ mJ/cm$^2$, and $L1=L2=0.3$ mm.

The energy density E1 is set in a range of properly crystallizing an amorphous silicon film. A typical range is 100 mJ/cm$^2 < E1 < 200$ mJ/cm$^2$.

The energy density E2 is set in a range of properly improving the crystallinity of a silicon film that has been irradiated at the energy density E1. A typical range is 200 mJ/cm$^2 < E2 < 300$ mJ/cm$^2$.

Each of the energy densities E1 and E2 includes a variation range of ±5%.

Linear laser light is interrupted by the mask 301 over a width of about 0.1 mm in the line-width direction. As a result, the leading edge of the energy density profile of laser light is made steeper.

Laser light having the energy density E1 has a role of crystallizing an amorphous silicon film. Laser light having the energy density E2 has a role of improving the crystallinity, such as increasing crystal grain sizes, of the entire crystalline silicon film that has been crystallized by laser light having the energy density E1.

In connection with L1 and L2, the pitch D of the scanning with laser light is set at 0.06 mm. As a result, the same location is irradiated with laser light of the same energy density E1 or E2 five times (0.3 mm/0.06 mm=5).

In a laser annealing experiment that was performed under the above conditions, the crystallinity was sufficiently improved by one scanning. Further, in spite of unavoidable sudden decreases of 5–10% in the output power of a laser light source, the surface of a crystalline silicon film as annealed was extremely uniform without any stripe-like roughening.

Next, a plurality of thin-film transistors (TFTs) are formed in the same manner as in the third embodiment by using the crystalline silicon film that has been crystallized and improved in crystallinity by the laser annealing.

Various characteristics of a plurality of thin-film transistors formed according to this embodiment were extremely uniform over the same substrate surface.

Embodiment 5

Figure 12:
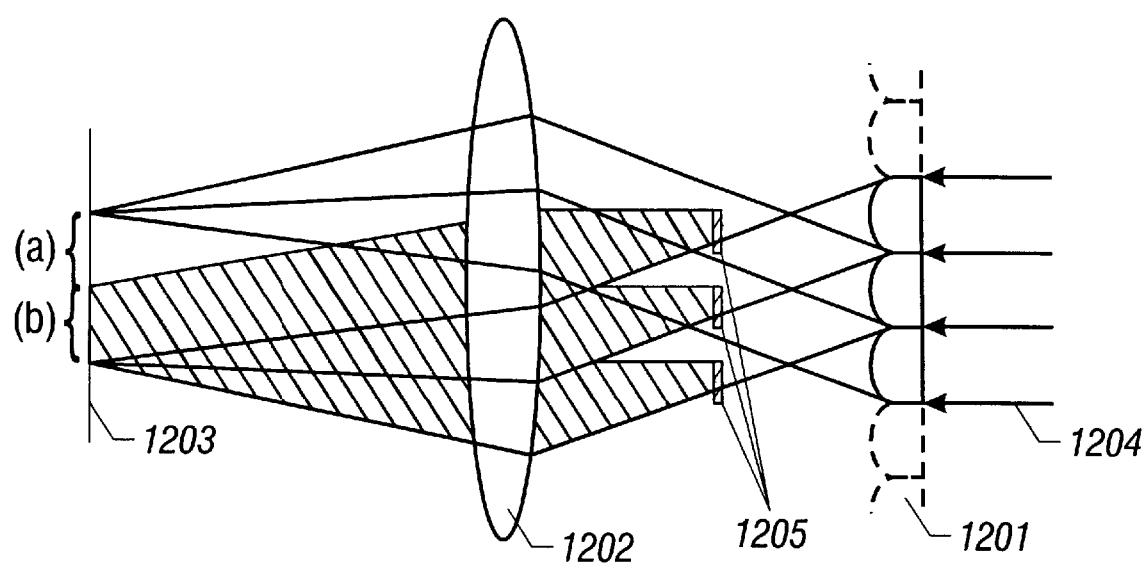
FIG. 12 shows an example of a homogenizer according to a fifth embodiment in which an attenuation filter is inserted.

This embodiment is directed to another method of obtaining a step-like energy density profile. That is, an attenuation filter is inserted into a homogenizer for making uniform laser light, as shown in FIG. 12.

A homogenizer is composed of a plurality of cylindrical lenses that are arranged in parallel with each other. Laser light having a several centimeter-square, spot-like cross-section emitted from a laser light source enters the homogenizer. The laser light is first converged in the rear of the respective cylindrical lenses and is then diverged.

The laser light diverged by the respective cylindrical lenses is converged by a convex lens. By performing the above processing in each of the vertical and horizontal directions in the laser light cross-section, the laser light is given an approximately square or rectangular cross-section with a uniform energy density profile.

The ratio between the vertical and horizontal lengths of the laser light in its cross-section is changed by causing the laser light having a square or rectangular cross-section to pass through the convex lens, which converges the laser light. As a result, linear laser light having a desired line-width is obtained on the irradiation surface. The vertical and horizontal lengths of the laser light are determined by the curvature of the convex lens.

The linear laser light thus obtained has an energy density profile that is uniform in both of the longitudinal and line-width directions on the irradiation surface.

According to this embodiment, as shown in FIG. 12, attenuation filters 1205 are disposed downstream of respective cylindrical lenses of a homogenizer 1201 for making uniform linear laser light in the line-width direction. Alternatively, the attenuation filters 1205 may be disposed upstream of the respective cylindrical lenses.

As shown in FIG. 12, after laser light 1204 has passed through the homogenizer 1201, an energy density reduction occurs in portions that have been transmitted through the attenuation filters 1205. For example, the attenuation filter 1205 is provided to cover a bottom portion of a section corresponding to each cylindrical lens that constitutes the homogenizer 1201 for making uniform laser light in the vertical direction. That is, one attenuation filter 1205 is provided for each cylindrical lens.

The structure should be adapted such that an attenuation filter 1205 for one cylindrical lens does not interrupt light passed through (or to enter) another cylindrical lens.

Laser light converged by a convex lens 1202 and hence having a uniform energy density profile is applied to an irradiation surface 1203.

As shown in FIG. 12, there exist, on the irradiation surface 1204, area (a) which is irradiated with laser light that has not been transmitted through the attenuation filters 1205 and area (b) which is irradiated with laser light that has been transmitted through the attenuation filters 1205.

Since the energy density is low on area (b), laser light energy density profile on the irradiation surface 1203 assumes a step-like form. The top-bottom direction in FIG. 12 corresponds to the line-width direction of linear laser light. Therefore, the energy density profile in the line-width direction can be made a step-like one.

In the method of this embodiment, the energy applied to each attenuation filter during laser irradiation is much smaller than in the method for obtaining a step-like energy density profile described in the first embodiment. This allows the filter characteristics to be kept stable for a long time.

According to this embodiment, the length on the line-width direction of the low-energy density section can be controlled by the width of the attenuation filters for the respective cylindrical lenses.

The leading edge of the energy density profile may be made steeper by inserting a mask or slit between the convex lens 1202 and the irradiation surface 1203.

No particular limitation is imposed on a tail portion of the energy density profile.

As described above, the invention provides, in the laser annealing on a semiconductor thin film which uses linear laser light, great advantages such as improvement in crystallinity, shortening of manufacturing steps, improvement in the intrasurface uniformity of film quality, and avoidance of influences of output power variations of a laser light source.

What is claimed:

1. A laser irradiation apparatus comprising:

a laser device to generate a laser beam;

a stage arranged to hold an object to be irradiated with said laser beam; and an attenuation filter located on an optical path between said laser device and said stage to reduce an energy density of said laser beam, wherein said laser beam has at least a first portion having a lower energy density than a second portion along a scan direction of said object by passing through said attenuation filter at a surface of said object.

2. A laser irradiation apparatus according to claim 1 wherein the energy density in each of said first and second portions is substantially uniform.

3. A laser irradiation apparatus according to claim 1 wherein said object is a semiconductor film formed over a substrate.

4. A laser irradiation apparatus according to claim 1 wherein said laser beam has a cross section elongated in one direction at said object by passing through a cylindrical lens.

5. A laser irradiation apparatus comprising:

a laser device to generate a laser beam;

a stage arranged to hold an object to be irradiated with said laser beam;

an attenuation filter located on an optical path between said laser device and said stage for reducing an energy density of said laser beam, wherein said laser beam has at least a first portion having a lower energy density than a second portion by passing through said attenuation filter at a surface of said object; and means for moving said stage with said object so that a portion of said object is irradiated with said first portion of the laser beam and subsequently with said second portion along a moving direction.

6. A laser irradiation apparatus according to claim 5 wherein the energy density in each of said first and second portions is substantially uniform.

7. A laser irradiation apparatus according to claim 5 wherein said object is a semiconductor film formed over a substrate.

8. A laser irradiation apparatus according to claim 5 wherein said laser beam has a cross section elongated in one direction at said object by passing through a cylindrical lens.

9. A method of manufacturing a semiconductor device comprising:

forming a semiconductor layer on an insulating surface of a substrate;

irradiating said semiconductor layer with a laser beam, wherein a portion of said laser beam passes through an attenuation filter so that said laser beam has at least a first portion having a lower energy density than a second portion along a scan direction of said substrate at a surface of said semiconductor layer.

10. A method according to claim 9 wherein said semiconductor layer is crystallized by the irradiation of said laser beam.

11. A method according to claim 9 further comprising a step of moving said semiconductor layer over a stage which holds said substrate relative to said laser beam so that a portion of said semiconductor layer is irradiated with said first portion of the laser beam and subsequently with the second portion of the laser beam.

12. A method according to claim 11 wherein the energy density in said first portion is between 100 and 250 mJ/cm$^2$ while the energy density in said second portion is between 200 and 300 mJ/cm$^2$.

13. A method according to claim 11 wherein the energy density in each of said first and second portions is substantially uniform.

14. A method according to claim 11 wherein said laser beam has a cross section elongated in one direction at said object by passing through a cylindrical lens.

15. A laser irradiation apparatus comprising:

a laser device to generate a laser beam;

a plurality of cylindrical lenses arranged in parallel for converging said laser beam in only one direction;

a convex lens arranged to converge the laser beam in only said one direction after passing through said plurality of cylindrical lenses; and a plurality of attenuation filters disposed between each one of said plurality of cylindrical lenses and said convex lens, wherein each of said attenuation filters is disposed so that only a part of the laser beam passing through the corresponding cylindrical lenses is attenuated.

16. A laser irradiation apparatus according to claim 15 wherein said laser beam comprises an excimer laser beam.

17. A laser irradiating apparatus comprising:

a laser device to generate a laser beam;

a mirror for bending an optical path of said laser beam;

a stage arranged to hold an object to be irradiated with said laser beam;

an attenuation filter located on said optical path between said mirror and said stage to reduce an energy density of said laser beam, wherein said laser beam has at least a portion having a lower energy density than a second portion along a scan direction of said object by passing through said attenuation filter at a surface of said object.

18. A laser irradiation apparatus according to claim 17 wherein said energy density in each of said first and second portions is substantially uniform.

19. A laser irradiation apparatus according to claim 17 wherein said object is a semiconductor film formed over a substrate.

20. A laser irradiation apparatus according to claim 17 wherein said laser beam has a cross section elongated in one direction at said object by passing through a cylindrical lens.

* * * * *